(12) United States Patent
Tsai et al.

(10) Patent No.: US 11,557,561 B2
(45) Date of Patent: Jan. 17, 2023

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Hui-Jung Tsai, Hsinchu (TW); Hung-Jui Kuo, Hsinchu (TW); Jyun-Siang Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 234 days.

(21) Appl. No.: 17/106,161

(22) Filed: Nov. 29, 2020

(65) Prior Publication Data

US 2021/0082858 A1 Mar. 18, 2021

Related U.S. Application Data

(63) Continuation of application No. 16/027,275, filed on Jul. 4, 2018, now Pat. No. 10,854,570.

(Continued)

(51) Int. Cl.
*H01L 23/00* (2006.01)
*H01L 21/48* (2006.01)
(Continued)

(52) U.S. Cl.
CPC ............ *H01L 24/25* (2013.01); *H01L 21/486* (2013.01); *H01L 21/4853* (2013.01); *H01L 21/4857* (2013.01); *H01L 23/5389* (2013.01); *H01L 24/19* (2013.01); *H01L 24/20* (2013.01); *H01L 24/24* (2013.01); *H01L 25/0655* (2013.01); *H01L 25/50* (2013.01); *H01L 23/49816* (2013.01); *H01L 24/16* (2013.01);
(Continued)

(58) Field of Classification Search
CPC ............ H01L 21/4853; H01L 21/4857; H01L 21/486; H01L 23/49816; H01L 23/5389; H01L 24/16; H01L 24/19; H01L 24/20; H01L 24/24; H01L 24/25; H01L 24/73; H01L 25/0655; H01L 25/50
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Brook Kebede
(74) *Attorney, Agent, or Firm* — JCIPRNET

(57) ABSTRACT

A method of fabricating an integrated fan-out package is provided. The method includes the following steps. An integrated circuit component is provided on a substrate. An insulating encapsulation is formed on the substrate to encapsulate sidewalls of the integrated circuit component. A redistribution circuit structure is formed along a build-up direction on the integrated circuit component and the insulating encapsulation. The formation of the redistribution circuit structure includes the following steps. A dielectric layer and a plurality of conductive vias embedded in the dielectric layer are formed, wherein a lateral dimension of each of the conductive vias decreases along the build-up direction. A plurality of conductive wirings is formed on the plurality of conductive vias and the dielectric layer. An integrated fan-out package of the same is also provided.

20 Claims, 16 Drawing Sheets

Related U.S. Application Data

(60) Provisional application No. 62/537,946, filed on Jul. 27, 2017.

(51) Int. Cl.
    *H01L 25/065*      (2006.01)
    *H01L 25/00*      (2006.01)
    *H01L 23/538*      (2006.01)
    *H01L 23/498*      (2006.01)

(52) U.S. Cl.
CPC ...... *H01L 24/73* (2013.01); *H01L 2224/0401* (2013.01); *H01L 2224/04105* (2013.01); *H01L 2224/12105* (2013.01); *H01L 2224/131* (2013.01); *H01L 2224/16238* (2013.01); *H01L 2224/24155* (2013.01); *H01L 2224/24265* (2013.01); *H01L 2224/2501* (2013.01); *H01L 2224/25171* (2013.01); *H01L 2224/32225* (2013.01); *H01L 2224/73209* (2013.01); *H01L 2224/73267* (2013.01); *H01L 2224/81005* (2013.01); *H01L 2224/81355* (2013.01); *H01L 2224/81815* (2013.01); *H01L 2224/92244* (2013.01); *H01L 2224/94* (2013.01); *H01L 2224/97* (2013.01); *H01L 2924/15311* (2013.01); *H01L 2924/15313* (2013.01); *H01L 2924/18161* (2013.01)

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2017/0098628 A1* | 4/2017 | Liu .................. H01L 23/3142 |
| 2017/0125346 A1* | 5/2017 | Liu .................. H01L 21/76895 |

* cited by examiner

PACKAGE STRUCTURE AND METHOD OF FABRICATING THE SAME

CROSS-REFERENCE TO RELATED APPLICATION

This application is a continuation application of U.S. application Ser. No. 16/027,275, filed on Jul. 4, 2018, now allowed. The prior application Ser. No. 16/027,275 claims the priority benefit of U.S. provisional application Ser. No. 62/537,946, filed on Jul. 27, 2017. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. The improved routing capability and reliability provided by the integrated fan-out packages are key factors for future packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
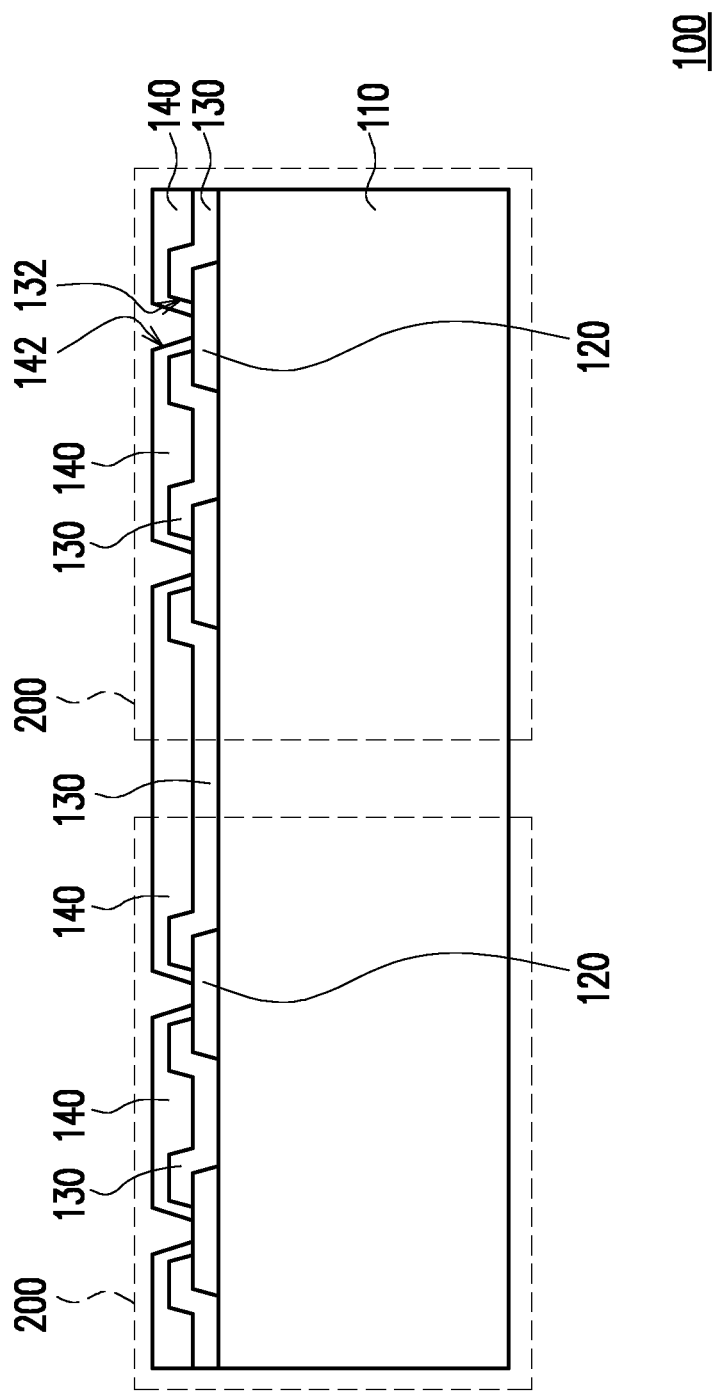
FIG. 1 to FIG. 12 illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 12 illustrate a process flow for fabricating an integrated fan-out package in accordance with some embodiments.

Referring to FIG. 1, a wafer 100 including a plurality of dies or integrated circuit components 200 which are arranged in an array is provided. Before performing a wafer dicing process on the wafer 100, the integrated circuit components 200 of the wafer 100 are physically connected to one another. In some embodiments, the wafer 100 includes a semiconductor substrate 110, a plurality of conductive pads 120 formed on the semiconductor substrate 110, and a passivation layer 130. The passivation layer 130 is formed over the substrate 110 and has a plurality of contact openings 132 such that the conductive pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the wafer 100 may optionally include a post-passivation layer 140 formed over the passivation layer 130. The post-passivation layer 140 covers the passivation layer 130 and has a plurality of contact openings 142. The conductive pads 120 partially exposed by the contact openings 132 of the passivation 130 are partially exposed by the contact openings 142 of the post passivation layer 140. For example, the post-passivation layer 140 may be a polyimide (PI) layer, a polybenzoxazole (PBO) layer, a benzocyclobutene (BCB) layer, or a dielectric layer made from other suitable polymers, or the like. In some embodiments, the dielectric layer is formed of a nitride such as silicon nitride; an oxide such as silicon oxide, phosphosilicate glass (PSG), borosilicate glass (BSG), boron-doped phosphosilicate glass (BPSG) or the like. In certain embodiments, the passivation layer 130 and the post-passivation layer 140 may be formed by any acceptable deposition process, such as spin coating, chemical vapor deposition (CVD), lamination, or the like, or a combination of these methods.

Figure 2:
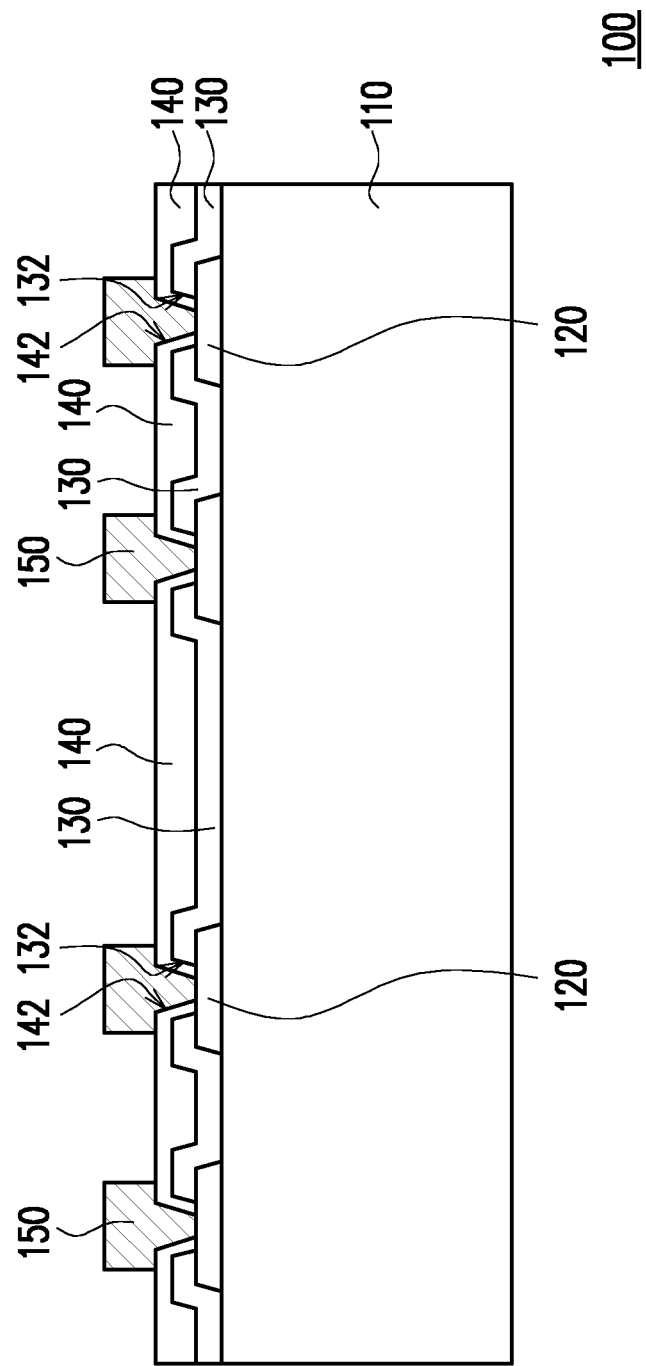

Referring to FIG. 2, a plurality of conductive pillars 150 are formed on the conductive pads 120 of the wafer 100. In some embodiments, the conductive pillars 150 are formed on the conductive pads 120 by a plating process of a conductive material. The plating process of conductive pillars 150 is described in detail as followings. First, a seed layer is sputtered onto the post-passivation layer 140 and the conductive pads 120 exposed by the contact openings 142. A patterned photoresist layer (not shown) having a predetermined pattern is then formed over the seed layer by spin coating of a photoresist material layer, baking of the photoresist material layer, and photolithography (i.e. exposure and development processes). Portions of the seed layer that are corresponding to the conductive pads 120 are exposed by the patterned photoresist layer. The wafer 100 including the patterned photoresist layer formed thereon is then immersed into a plating solution in a plating bath such that the conductive pillars 150 are plated on the portions of the seed layer that are corresponding to the conductive pads 120 and revealed by the patterned photoresist layer. After the conductive pillars 150 are formed, the patterned photoresist layer is stripped by, for example, etching, ash or other suitable removal processes. Thereafter, by using the conductive pillars 150 as a hard mask, another portion of the seed layer that are not covered by the conductive pillars 150 are removed through etching until the post passivation layer 140 is exposed, for example.

In some embodiments, the conductive pillars 150 are plated copper pillars or other suitable metallic pillars. In some alternative embodiments, the conductive pillars 150 are copper pillars or other suitable metallic pillars which are covered by solder caps (e.g., lead-free solder caps). In certain embodiments, a material of the conductive pillars 150 may include copper, tungsten, aluminum, silver, gold, or the like, or a combination thereof. In some embodiments, these conductive materials may be formed by an electro-chemical plating process, an electroless plating process, chemical vapor deposition (CVD), atomic layer deposition (ALD), physical vapor deposition (PVD), or the like, or a combination thereof.

Figure 3:
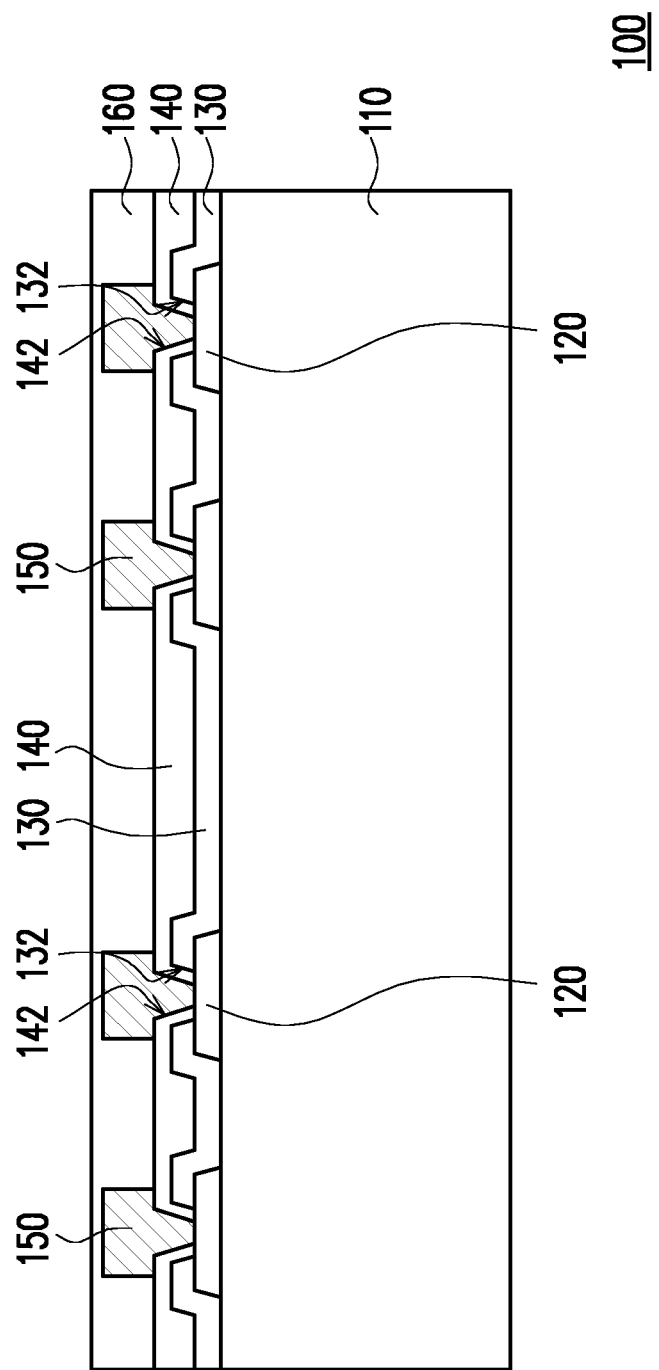

Referring to FIG. 3, after forming the conductive pillars 150, a protection layer 160 is formed on the post passivation layer 140 of the wafer 100 such that the conductive pillars 150 are covered by the protection layer 160. In some embodiments, the protection layer 160 may be a polymer layer having sufficient thickness to encapsulate and protect the conductive pillars 150. In some embodiments, the protection layer 160 may be a polybenzoxazole (PBO) layer, a polyimide (PI) layer, a benzocyclobutene (BCB) layer, or a dielectric layer made from other suitable polymers, or the like. In some embodiments, the dielectric layer is formed of a nitride such as silicon nitride; an oxide such as silicon oxide, phosphosilicate glass (PSG), borosilicate glass (BSG), boron-doped phosphosilicate glass (BPSG) or the like. In certain embodiments, the protection layer 160 may be formed by any acceptable deposition process, such as spin coating, chemical vapor deposition (CVD), lamination, or the like, or a combination of these methods. In some alternative embodiments, the protection layer 160 may be made of inorganic materials. As shown in FIG. 3, the protection layer 160 has a substantially planar top surface and a maximum thickness of the protection layer 160 is greater than a height of the conductive pillars 150.

Figure 4:
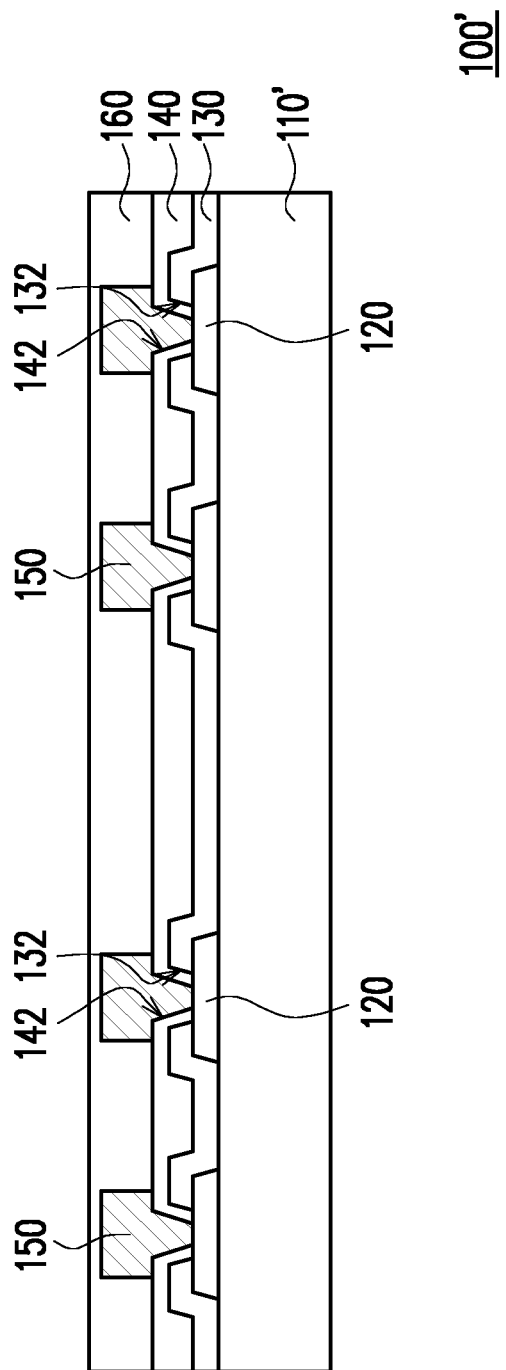

Referring to FIG. 4, after forming the protection layer 160, a back side grinding process may be optionally performed on the back surface of the wafer 100. During the back side grinding process, the semiconductor substrate 110 is partially grinded such that a thinned wafer 100' including a thinned semiconductor substrate 110' is formed. In some embodiments, the back surface of the wafer 100 may be grinded by mechanical grinding or other suitable grinding or polishing processes.

Figure 5:
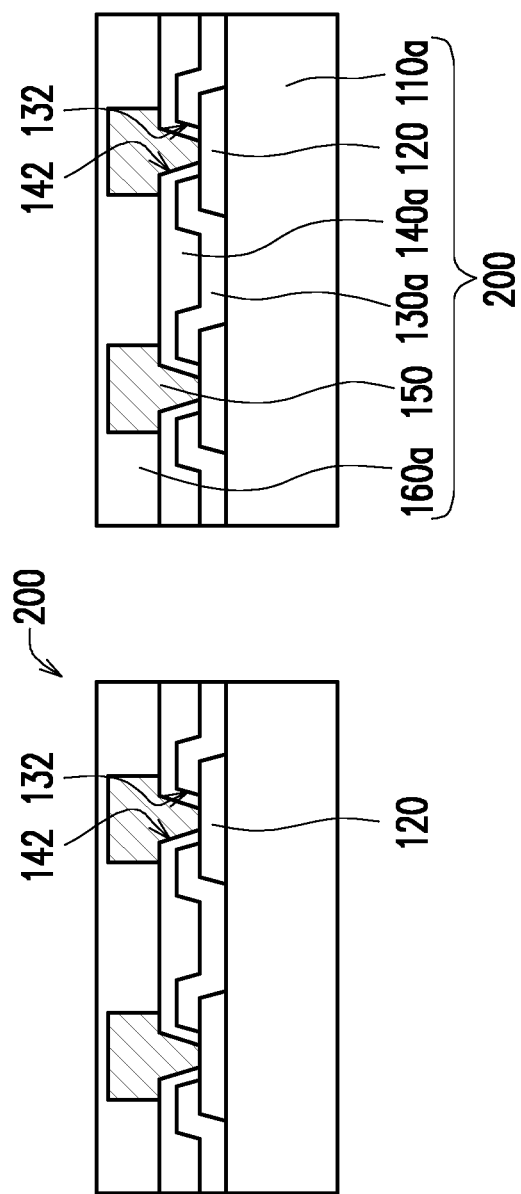

Referring to FIG. 5, after performing the back side grinding process, a wafer dicing process is performed on the thinned wafer 100' such that the integrated circuit components 200 in the thinned wafer 100' are singulated from one another. Each one of the singulated integrated circuit components 200 may include a semiconductor substrate 110a, the conductive pads 120 formed on the semiconductor substrate 110a, a passivation layer 130a, a post passivation layer 140a, the conductive pillars 150, and a protection layer 160a. As shown in FIG. 4 and FIG. 5, the materials and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a are omitted.

As shown in FIG. 4 and FIG. 5, during the back side grinding process and the wafer dicing process, the protection layer 160 and 160a may well protect the conductive pillars 150 of the integrated circuit components 200. In addition, the conductive pillars 150 of the integrated circuit components 200 may be protected from being damaged by sequentially performed processes, such as the pick-up and placing process of the integrated circuit components 200, the molding process, and so on.

Figure 6:
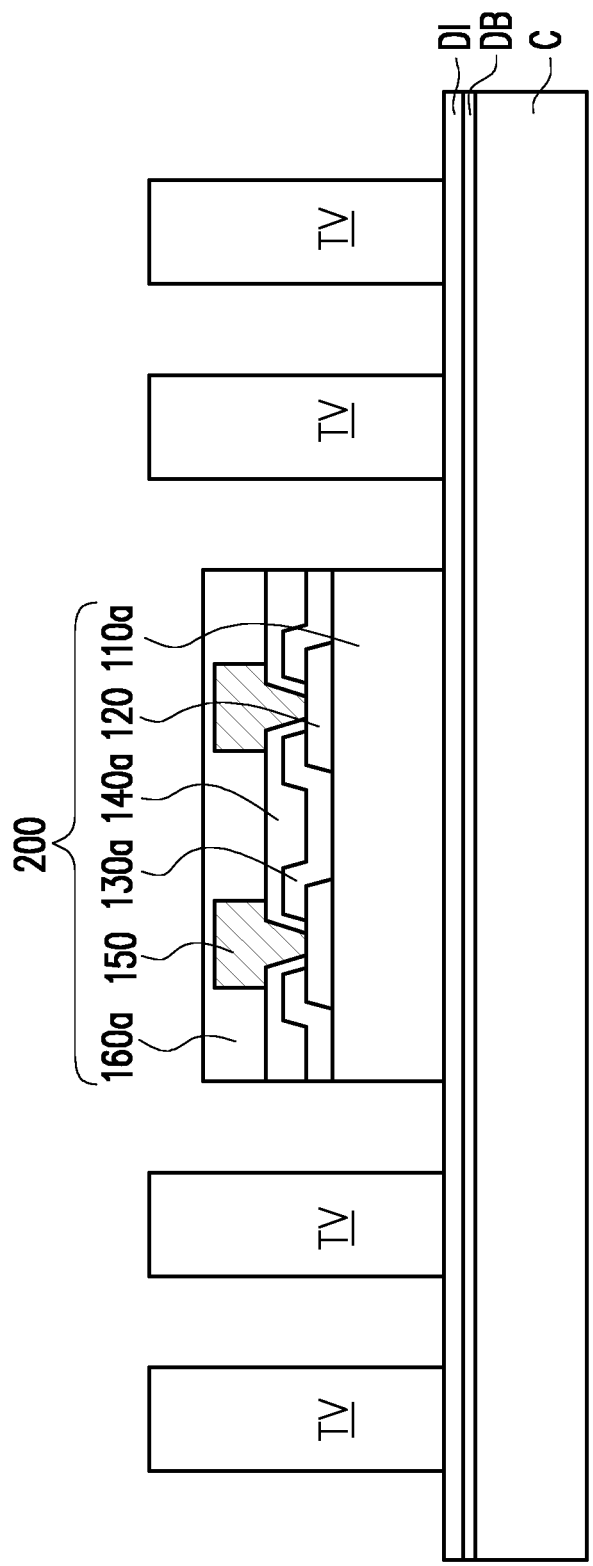

Referring to FIG. 6, after the integrated circuits 200 are singulated from the thinned wafer 100' (shown in FIG. 4), a carrier substrate C having a de-bonding layer DB and a dielectric layer DI formed thereon is provided, wherein the de-bonding layer DB is between the carrier substrate C and the dielectric layer DI. In some embodiments, the carrier substrate C may be a glass substrate, the de-bonding layer DB may be a light-to-heat conversion (LTHC) release layer formed on the glass substrate, and the dielectric layer DI may be a polybenzoxazole (PBO) layer, a polyimide (PI) layer, a benzocyclobutene (BCB) layer, or other types of dielectric layer that is formed on the de-bonding layer DB. The other types of dielectric layers may include nitride such as silicon nitride; an oxide such as silicon oxide, phosphosilicate glass (PSG), borosilicate glass (BSG), boron-doped phosphosilicate glass (BPSG) or the like. The dielectric layer DI may be formed by any acceptable deposition process, such as spin coating, chemical vapor deposition (CVD), lamination, or the like, or a combination of these methods.

After the carrier substrate C having the de-bonding layer DB and the dielectric layer DI formed thereon is provided, a plurality of conductive through vias TV are formed on the dielectric layer DI. In some embodiments, the plurality of conductive through vias TV is formed by spin coating of a photoresist material layer, baking of the photoresist material layer, photolithography (i.e. exposure and development processes), plating (e.g., electro-plating or electro-less plating), and photoresist stripping processes. For example, the conductive through vias TV include copper posts or other suitable metallic posts.

In some embodiments, before the formation of the conductive through vias TV, a back side redistribution circuit structure (not shown) may be formed on the dielectric layer DI carried by the carrier C and the conductive through vias TV may be formed on and electrically connected to the back side redistribution circuit structure.

As shown in FIG. 6, in some embodiments, one of the integrated circuit component 200 including the conductive pads 120, the conductive pillars 150, and a protection layer 160a formed thereon is picked and placed on the dielectric layer DI carried by the carrier substrate C. The integrated circuit components 200 is attached or adhered on the dielectric layer DI through a die attach film (DAF), an adhesion paste or the like. In some alternative embodiments, two or more of the integrated circuit components 200 are picked and placed on the dielectric layer DI carried by the carrier substrate C, wherein the integrated circuit components 200 placed on the dielectric layer DI may be arranged in an array. In some embodiments, when the integrated circuit components 200 placed on the dielectric layer DI are arranged in an array, the conductive through vias TV may be classified into groups. The number of the integrated circuit components 200 is corresponding to the number of the groups of the conductive through vias TV.

As shown in FIG. 6, in the illustrated embodiment, the top surface of the protection layer 160a is lower than the top surfaces of the conductive through vias TV, and the top surface of the protection layer 160a is higher than the top surfaces of the conductive pillars 150. However, the disclosure is not limited thereto. In some alternative embodiments, the top surface of the protection layer 160a may be substantially aligned with the top surfaces of the conductive through vias TV. In yet some alternative embodiments, the top surface of the protection layer 160a may be higher than the top surfaces of the conductive through vias TV and the top surfaces of the conductive pillars 150 may be lower than, higher than or substantially aligned with the top surfaces of the conductive through vias TV.

As shown in FIG. 6, the integrated circuit component 200 is picked and placed on the dielectric layer DI after the formation of the conductive through vias TV. However, the disclosure is not limited thereto. In some alternative embodiments, the integrated circuit component 200 is picked and placed on the dielectric layer DI before the formation of the conductive through vias TV.

Figure 7:
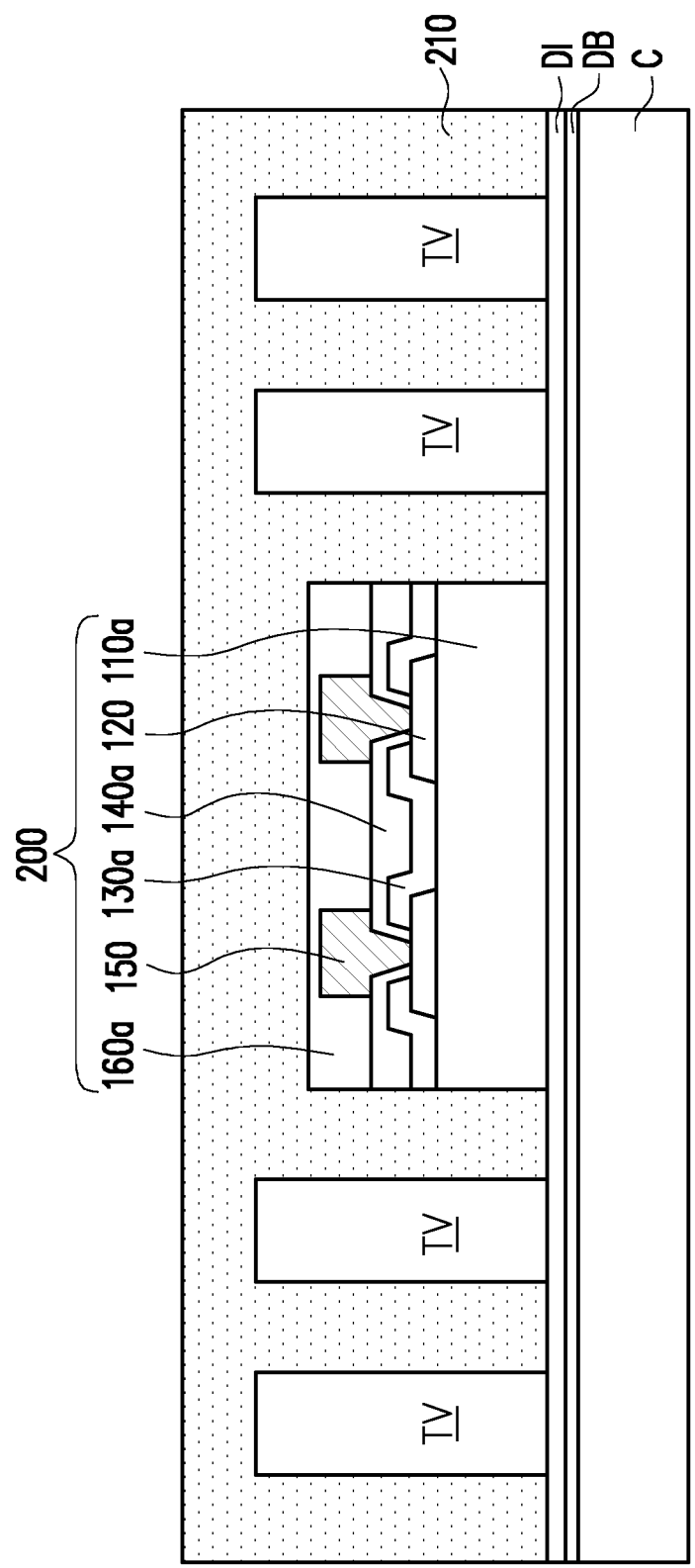

Referring to FIG. 7, an insulating material 210 is formed on the dielectric layer DI to cover the integrated circuit component 200 and the conductive through vias TV. In some embodiments, the insulating material 210 is a molding compound formed by a molding process. The conductive pillars 150 and the protection layer 160a of the integrated circuit component 200 are covered by the insulating material 210. In other words, the conductive pillars 150 and the protection layer 160a of the integrated circuit component 200 are not revealed and are well protected by the insulating material 210. In some embodiments, the insulating material 210 includes epoxy resin or other suitable dielectric materials.

Figure 8:
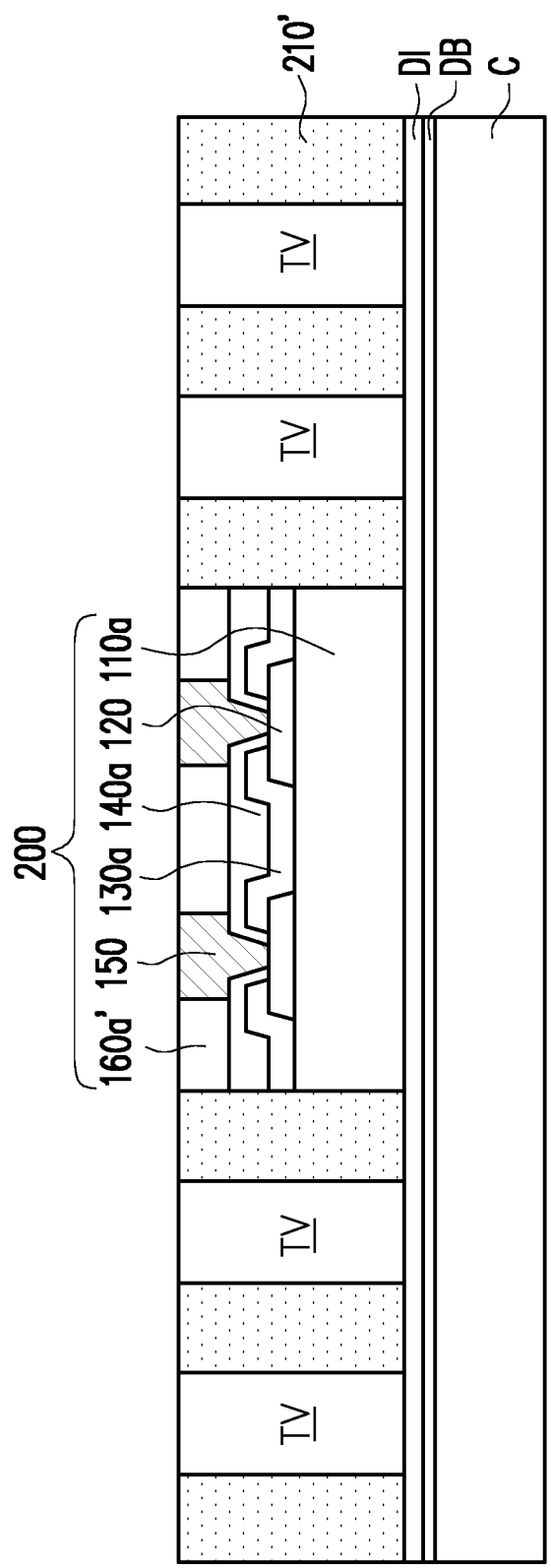

Referring to FIG. 8, the insulating material 210 is then grinded until the top surfaces of the conductive pillars 150, the top surfaces of the conductive through vias TV, and the top surface of the protection layer 160a are exposed. In some embodiments, the insulating material 210 is grinded by a mechanical grinding process and/or a chemical mechanical polishing (CMP) process. After the insulating material 210 is grinded, an insulating encapsulation 210' is formed over the dielectric layer DI. During the grinding process of the insulating material 210, portions of the protection layer 160a are grinded to form a protection layer 160a'. In some embodiments, during the grinding process of the insulating material 210 and the protection layer 160a, portions of the conductive through vias TV and portions of the conductive pillars 150 are slightly grinded also.

As shown in FIG. 8, the insulating encapsulation 210' laterally encapsulates sidewalls of the integrated circuit component 200 and the insulating encapsulation 210' is penetrated by the conductive through vias TV. In other words, the integrated circuit 200 and the conductive through vias TV are embedded in the insulating encapsulation 210'. It is noted that the top surfaces of the conductive through vias TV, the top surface of the insulating encapsulation 210', and the top surfaces of the conductive pillars 150 are substantially coplanar with the top surface of the protection layer 160a'.

Figure 9:
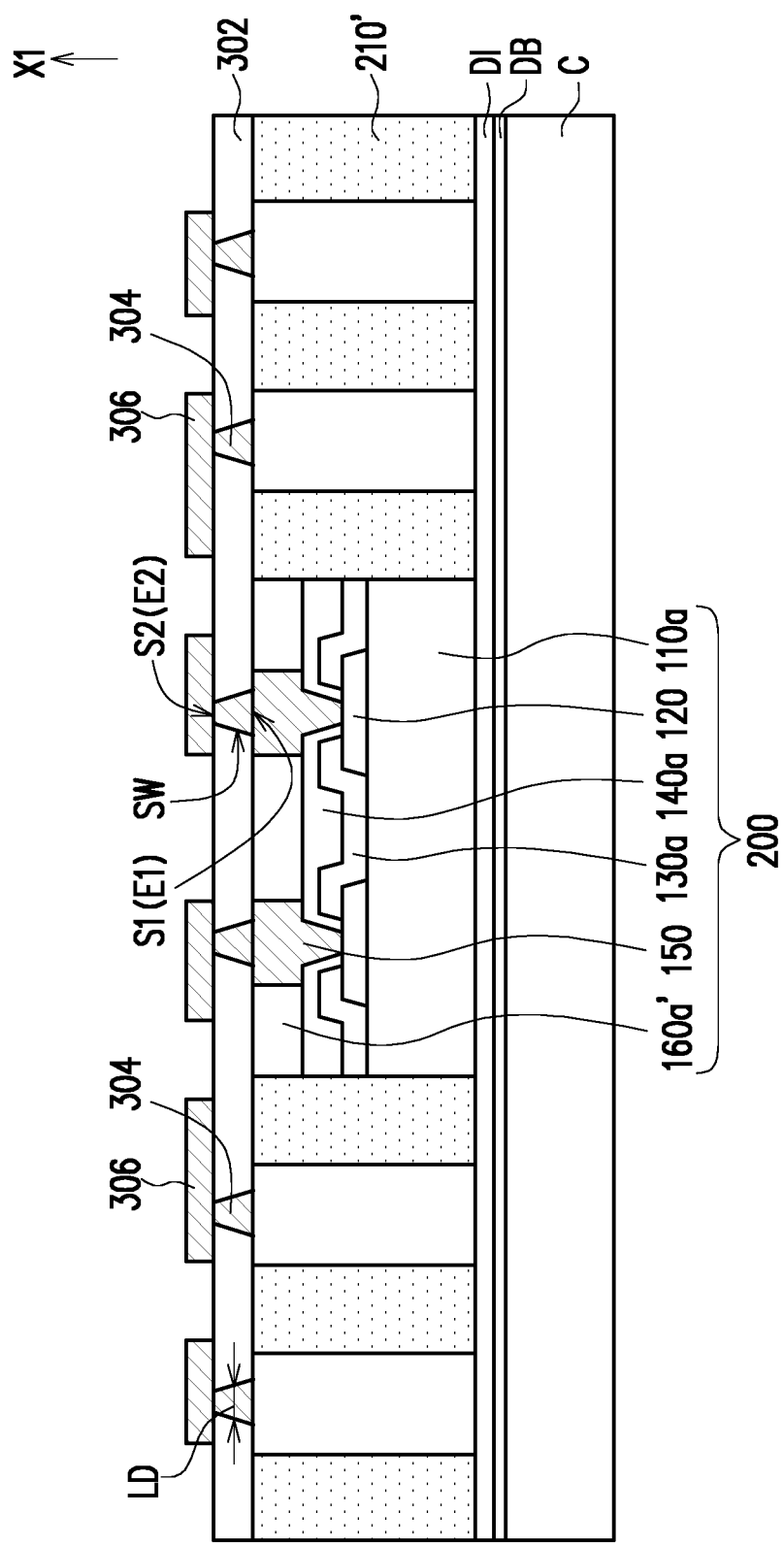

Referring to FIG. 9, after forming the insulating encapsulation 210' and the protection layer 160a', a redistribution circuit structure (300 in FIG. 10) is formed along a build-up direction X1 on the integrated circuit component 200 and the insulating encapsulation 210'. As shown in FIG. 9, in a first step of forming the redistribution circuit structure, a dielectric layer 302 and a plurality of conductive vias 304 embedded in the dielectric layer 302 are formed. A plurality of conductive wirings 306 are then formed on the plurality of conductive vias 304 and the dielectric layer 302, wherein the integrated circuit component 200 may or may not be connected to the conductive through vias TV through the conductive vias 304 and conductive wirings 306. In general, the build-up direction X1 refers to the direction where a plurality of dielectric layers 302 and a plurality of redistribution conductive layers (304 and 306) are alternately stacked up. For example, in some embodiments, the dielectric layer 302 and the redistribution conductive layers (304 and 306) are alternately stacked along a direction that is perpendicular to the carrier substrate C, which may be referred to as the build-up direction X1. In certain embodiments, the conductive vias 304 are alternately formed over the conductive wirings 306 along the build-up direction X1 in subsequent steps, and the conductive vias 304 allow electrical signals to pass to the upper layers.

Furthermore, in some embodiments, a lateral dimension LD of each of the conductive vias 304 decreases along the build-up direction X1. For example, each of the conductive vias 304 has a first surface S1 (first end E1) and a second surface S2 (second end E2) that is opposite to the first surface S1 (first end E1). The first surface S1 (first end E1) has a greater area than the second surface S2 (second end E2), and the second surface S2 (second end E2) is in contact with the plurality of conductive wirings 306. In some embodiments, the first surface S1 (first end E1) is located in between the second surface S2 (second end E2) and the integrated circuit component 200. The lateral dimension LD of each of the conductive vias 304 also decrease from the first surface S1 (first end E1) to the second surface S2 (second end E2). In some exemplary embodiments, the lateral dimension LD at the first surface S1 (first end E1) of the conductive vias 304 is in the range of 0.1 to 10 μm, and the lateral dimension LD at the second surface S2 (second end E2) of the conductive vias 304 is in the range of 0.1 to 10 μm. In certain embodiments, the first surface S1 (first end E1) is facing the carrier substrate C or facing the integrated circuit component 200, whereas the second surface S2 (second end E2) is facing away from the carrier substrate C or facing away from the integrated circuit component 200. As shown in FIG. 9, each of the conductive vias 304 has a tapered sidewall SW, the first surface S1 (first end E1) of the conductive vias 304 is joined with the second surface S2 (second end E2) of the conductive vias 304 through the tapered sidewall SW. In other words, by having the tapered sidewall SW, the conductive vias 304 may be viewed as having a trapezoid shaped profile.

Figure 10:
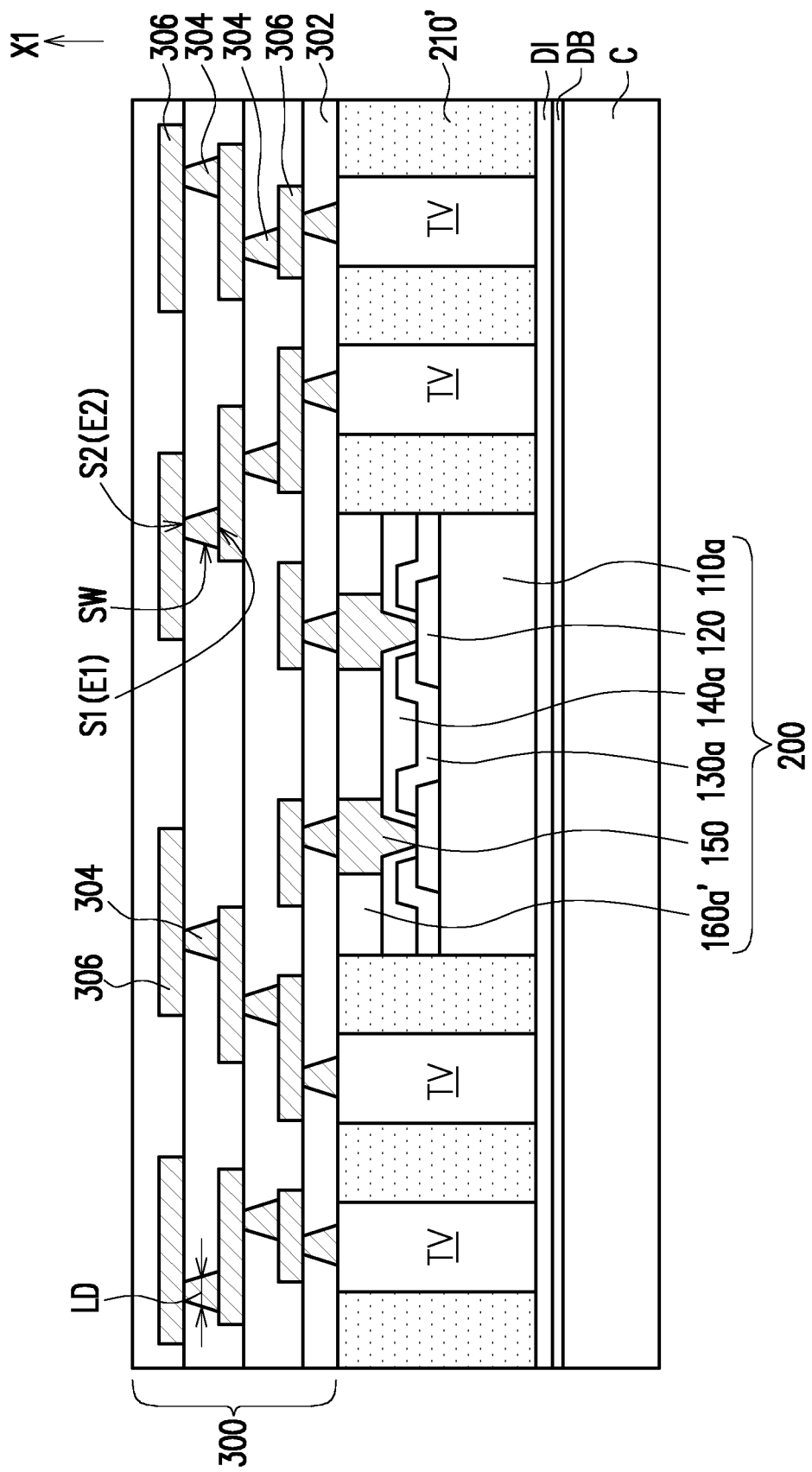

Referring to FIG. 10, the formation of the redistribution circuit structure 300 may be completed by repeating the formation of the dielectric layer 302, conductive vias 304 and conductive wirings 306 as shown and described in the embodiment of FIG. 9. For example, for forming the redistribution circuit structure 300 in the build-up direction X1, the plurality of conductive vias 304 can first be formed, the dielectric layer 302 is then formed after the formation of the conductive vias 304 to cover the conductive vias 304. The dielectric layer 304 may then be planarized to expose a top surface (second surface S2) of the conductive vias 304. The conductive wirings 306 are then formed to cover the exposed top surface (second surface S2) of the conductive vias 304, and to partially cover the dielectric layer 302. By alternately repeating the above steps, the formation of the redistribution circuit structure 300 is completed.

As shown in FIG. 10, in some embodiments, each of the conductive vias 304 are embedded in the dielectric layer 302, and all conductive vias 304 fulfills the condition where a lateral dimension LD of the conductive vias 304 decreases from a first surface S1 (first end E1) to a second surface S2 (second end E2). However, the disclosure is not limited thereto. For example, in alternative embodiments, only some of the conductive vias 304 in the redistribution circuit structure 300 have a tapered sidewall SW fulfilling the above conditions, while other conductive vias 304 may have vertical sidewalls. In alternative embodiments, in a redistribution circuit structure 300 having three stacked layers of dielectric layers 302 and redistribution conductive layers (304 and 306), only the conductive vias 304 in the first stacked layer (bottommost layer) adopts a tapered sidewall SW, while the conductive vias 304 in the second or third stacked layer have a vertical sidewall. Furthermore, in the embodiment shown in FIG. 10, although only three stacked layers of dielectric layers 302 and redistribution conductive layers (304 and 306) are presented in the redistribution circuit structure 300, however, the present disclosure is not limited thereto. In other embodiments, the redistribution circuit structure 300 may have three or more stacked layers of dielectric layers 302 and redistribution conductive layers (304 and 306) based on requirement.

Figure 11:
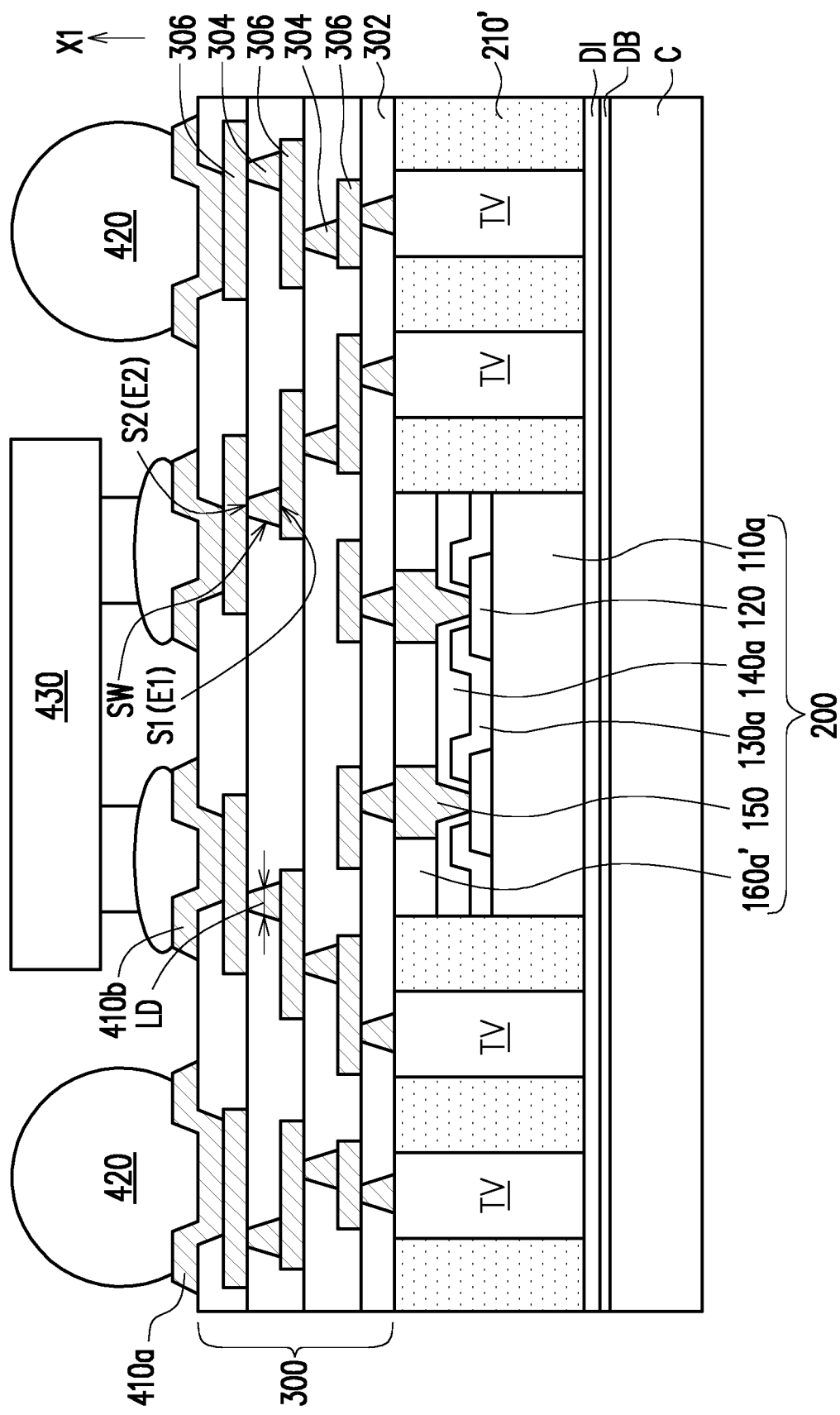

Referring to FIG. 11, after formation of the stacked layers of dielectric layers 302 and redistribution conductive layers (304 and 306), a plurality of under-ball metallurgy (UBM) patterns 410a for ball mount and/or at least one connection pads 410b for mounting of passive components may be formed. The number of the under-ball metallurgy patterns 410a and the connection pad 410b are not limited in this disclosure. As shown in FIG. 11, a plurality of conductive balls 420 are placed on the under-ball metallurgy patterns 410a, and one or more passive components 430 are mounted on the connection pads 410b. In some embodiments, the conductive balls 420 may be placed on the under-ball metallurgy patterns 410a by a ball placement process and the passive components 430 may be mounted on the connection pads 410b through a soldering process.

Figure 12:
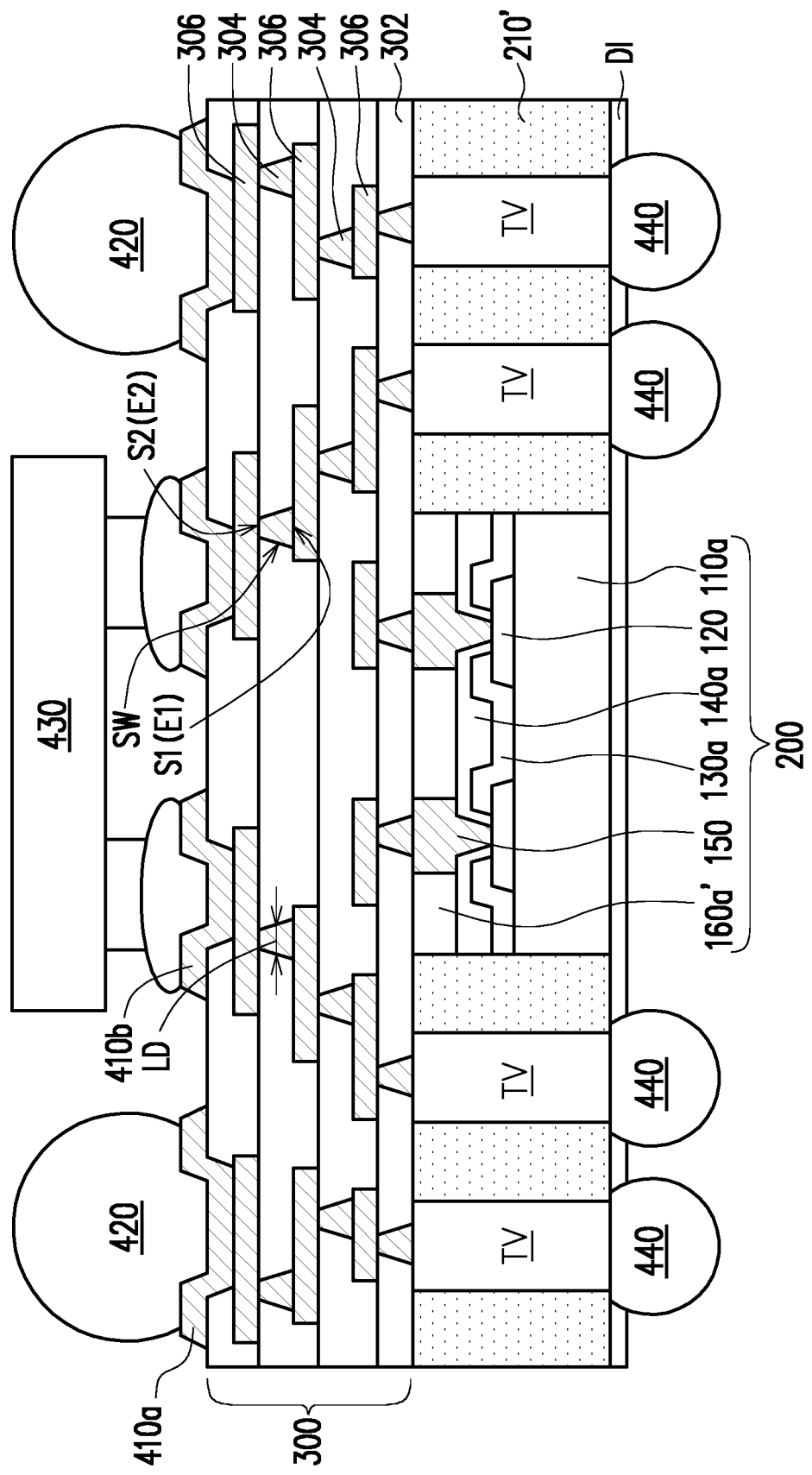

Referring to FIG. 12, after the conductive balls 420 and the passive components 430 are mounted on the redistribution circuit structure 300, the dielectric layer DI formed on the surface of the insulating encapsulation 210' is de-bonded from the de-bonding layer DB such that the dielectric layer DI is separated from the carrier substrate C. In some embodiments, the de-bonding layer DB (e.g., the LTHC release layer) may be irradiated by an UV laser such that the dielectric layer DI is peeled from the carrier substrate C. As shown in FIG. 12, the dielectric layer DI is then patterned such that a plurality of contact openings is formed to expose the bottom surfaces of the conductive through vias TIV. The number of the contact openings is corresponding to the number of the conductive through vias TIV. After the contact openings are formed in the dielectric layer DI, a plurality of conductive balls 440 are placed on the bottom surfaces of the conductive through vias TIV that are exposed by the contact openings. The conductive balls 440 are, for example, reflowed to bond with the bottom surfaces of the conductive through vias TIV. As shown in FIG. 12, after the conductive balls 420 and the conductive balls 440 are formed, an integrated fan-out package of the integrated circuit component 200 having dual-side terminals is accomplished.

FIG. 13 to FIG. 16 illustrate a process flow for fabricating an integrated fan-out package in accordance with some other embodiments. The difference between the embodiments shown in FIG. 13 to FIG. 16 as compared to the embodiments shown in FIG. 1 to FIG. 12 is that the redistribution circuit structure 300 is fabricated on the carrier substrate C prior to the formation/placement of the integrated circuit component 200.

Figure 13:
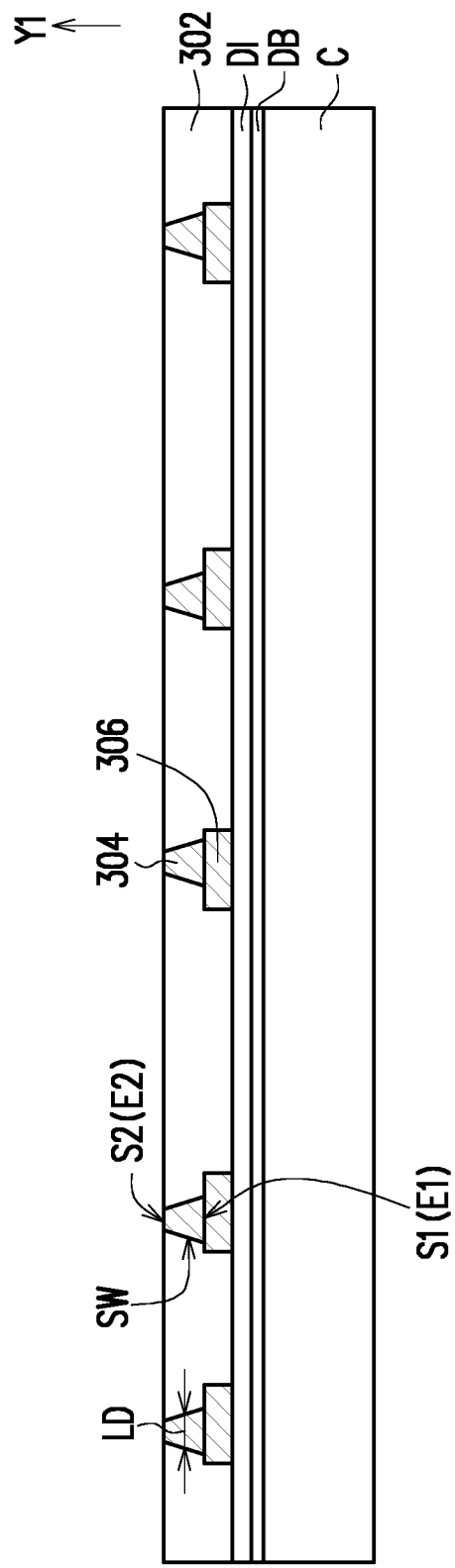
FIG. 13 to FIG. 16 illustrate a process flow for fabricating an integrated fan-out package in accordance with some other embodiments.

Referring to FIG. 13, in some embodiments, a redistribution circuit structure (300 in FIG. 14) is formed along a build-up direction Y1 on the carrier substrate C. Similar to the embodiment shown in FIG. 6, the carrier substrate C in FIG. 13 may have a de-bonding layer DB and a dielectric layer DI formed thereon. The description for the carrier substrate C, de-bonding layer DB and a dielectric layer DI may be referred to the embodiment shown in FIG. 6, and detailed discussion will be omitted. As shown in FIG. 13, in a first step of forming the redistribution circuit structure 300, a plurality of conductive wirings 306 is formed on the carrier substrate C. A plurality of conductive vias 304 and a dielectric layer 302 covering the conductive wirings 306 are then formed.

Similar to the conductive vias 304 described in the embodiment of FIG. 9, a lateral dimension LD of each of the conductive vias 304 shown in FIG. 13 decreases from a first end E1 (first surface S1) to a second end E2 (second surface S2) along the build-up direction Y1. The definition of the build-up direction Y1 is similar to the definition of the build-up direction X1, which refers to the direction where a plurality of dielectric layers 302 and a plurality of redistribution conductive layers (304 and 306) are alternately stacked up. In the embodiment shown in FIG. 13, the first end E1 (first surface S1) is facing the carrier substrate C and the second end E2 (second surface S2) is facing the integrated circuit component 200 (provided in subsequent steps), and the second end E2 (second surface) is located in between the integrated circuit component 200 (provided in subsequent steps) and the first end E1 (first surface S1). In some exemplary embodiments, the lateral dimension LD at the first surface S1 (first end E1) of the conductive vias 304 is in the range of 0.1 to 10 μm, and the lateral dimension LD at the second surface S2 (second end E2) of the conductive vias is in the range of 0.1 to 10 μm. However, the present disclosure is not limited thereto. As shown in FIG. 13, each of the conductive vias 304 has a tapered sidewall SW, the first end E1 (first surface S1) of the conductive vias 304 is joined with the second end E2 (second surface S2) of the conductive vias 304 through the tapered sidewall SW. In other words, by having the tapered sidewall SW, the conductive vias 304 may be viewed as having a trapezoid shaped profile.

Figure 14:
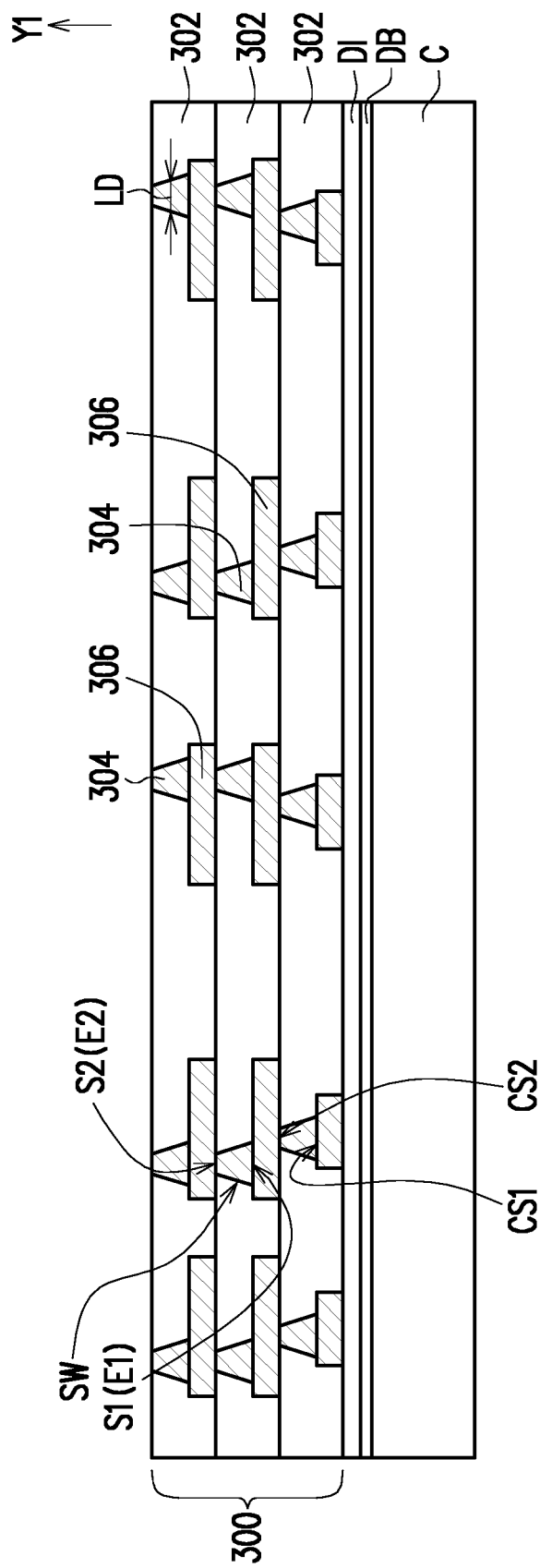

Referring to FIG. 14, the formation of the redistribution circuit structure 300 may be completed by repeating the formation of the dielectric layer 302, conductive vias 304 and conductive wirings 306 as shown and described in the embodiment of FIG. 13. For example, in some embodiments, for forming the redistribution circuit structure 300 in the build-up direction Y1, the plurality of conductive wirings 306 can first be formed on the carrier substrate C. Next, a first portion (not shown) of the dielectric layer 302 may then be formed on the plurality of conductive wirings 306. The first portion of the dielectric layer 302 may be planarized to expose a top surface of the conductive wirings 306. The plurality of conductive vias 304 are then formed on the top surface of the conductive wirings 306, such that the first end E1 (first surface S1) of the conductive vias 304 is in contact with the top surface of the conductive wirings 306. Subsequently, a second portion (not shown) of the dielectric layer 302 may be formed on the conductive vias 304 to cover the conductive vias 304, and then the second portion of the dielectric layer 302 may be planarized to expose the second end E2 (second surface S2) of the conductive vias 304. By alternately repeating the above steps, the formation of the redistribution circuit structure 300 shown in FIG. 14 is completed.

Alternatively, the formation of the redistribution circuit structure 300 shown in FIG. 14 may be completed by using another method. For example, in certain embodiments, for forming the redistribution circuit structure 300 in the build-up direction Y1, the plurality of conductive wirings 306 can first be formed on the carrier substrate C. Next, the plurality of conductive vias 304 may be formed on the conductive wirings 306. Subsequently, the dielectric layer 304 may be formed on both the conductive wirings 306 and the conductive vias 304, to cover the conductive wirings 306 and the conductive vias 304, wherein the dielectric layer 304 is planarized to expose the second end E2 (second surface S2) of the conductive vias 304. By alternately repeating the above steps, the formation of the redistribution circuit structure 300 shown in FIG. 14 is completed.

As shown in FIG. 14, a contact surface CS1 (interface) between the first end E1 (first surface S1) of the conductive vias 304 and the conductive wirings 306 is larger than a contact surface CS2 (interface) between the second end E2 (second surface S2) of the conductive vias 304 and another conductive feature (conductive wirings 306 or conductive bumps 310 formed subsequently). Furthermore, in some embodiments, each of the conductive vias 304 are embedded in the dielectric layer 302, and all fulfills the condition where a lateral dimension LD of the conductive vias 304 decreases from a first end E1 (first surface S1) to a second end E2 (second surface E2). However, the disclosure is not limited thereto. For example, in alternative embodiments, only some of the conductive vias 304 in the redistribution circuit structure 300 have a tapered sidewall SW fulfilling the above conditions, while other conductive vias 304 may have vertical sidewalls. Furthermore, in the embodiment shown in FIG. 14, although only three stacked layers of dielectric layers 302 and redistribution conductive layers (304 and 306) are presented in the redistribution circuit structure 300, however, the present disclosure is not limited thereto. In other embodiments, the redistribution circuit structure 300 may have three or more stacked layers of dielectric layers 302 and redistribution conductive layers (304 and 306) based on requirement.

Figure 15:
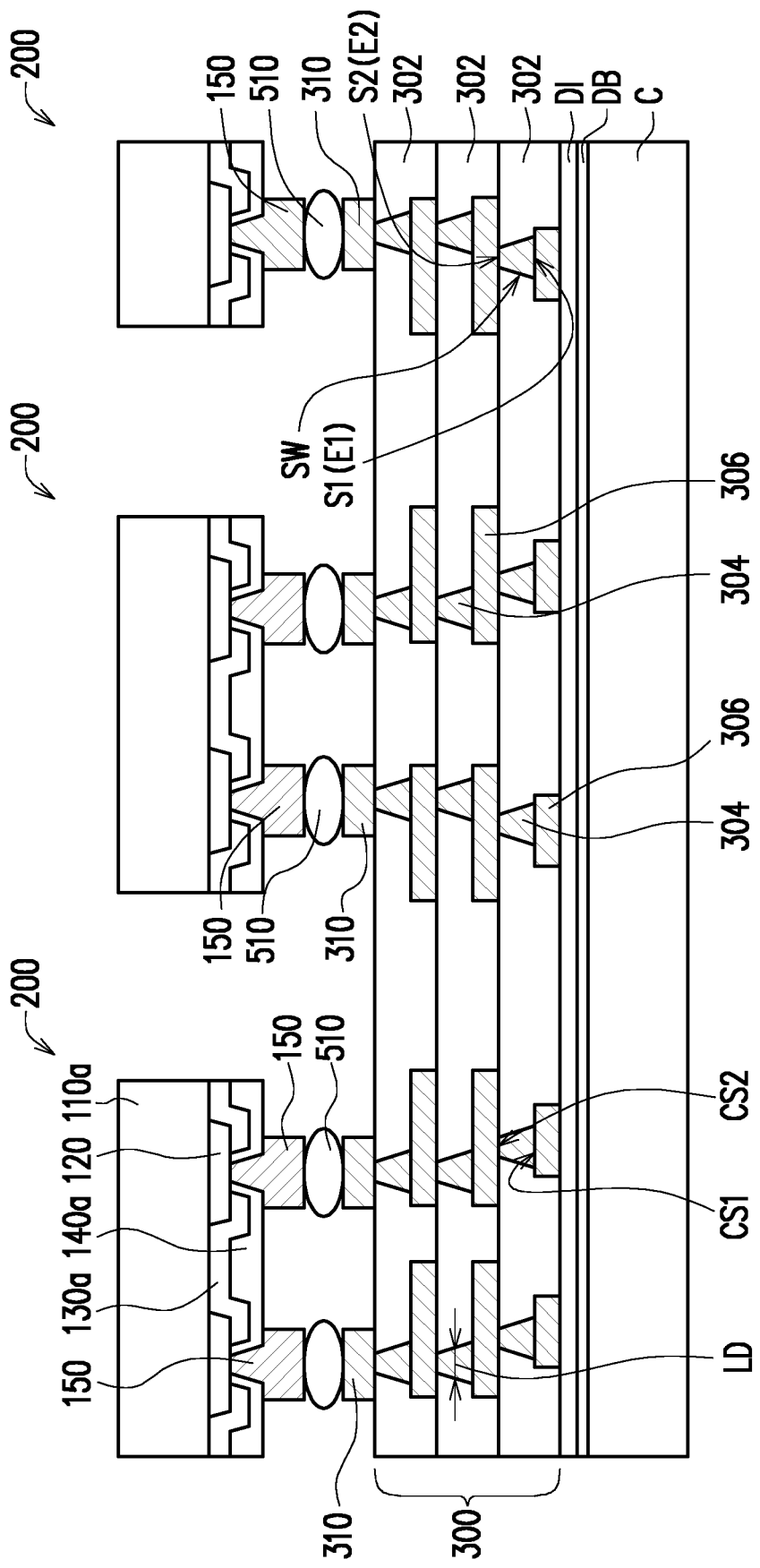

Referring to FIG. 15, after formation of the redistribution circuit structure 300, a plurality of conductive bumps 310 may be formed on the redistribution circuit structure 300, wherein the conductive bumps 310 are electrically connected to the plurality of conductive vias 304. For example, the conductive bumps 310 are in contact with the second end E2 (second surface S2) of the conductive vias 304. Subsequently, integrated circuit components 200 having a plurality of conductive pillars 150 may be provided and used for bonding to the redistribution circuit structure 300. The integrated circuit components 200 of FIG. 15 is similar to the integrated circuit components 200 described in FIG. 5, but without the protection layer 160a'. Therefore, the detailed description of the integrated circuit components 200 in FIG. 15 can be referred to the above embodiments, and will be omitted herein.

As shown in FIG. 15, in some embodiments, solder caps 510 may be formed on the conductive bumps 310 on the redistribution circuit structure 300 side, such that the conductive bumps 310 are bonded to the conductive pillars 150 through the solder caps 510. However, the present disclosure is not limited thereto. In alternative embodiments, the solder caps 510 may be formed on the conductive pillars 150 on the integrated circuit components 200 side, such that the conductive bumps 310 are bonded to the conductive pillars 150 through the solder caps 510.

Figure 16:
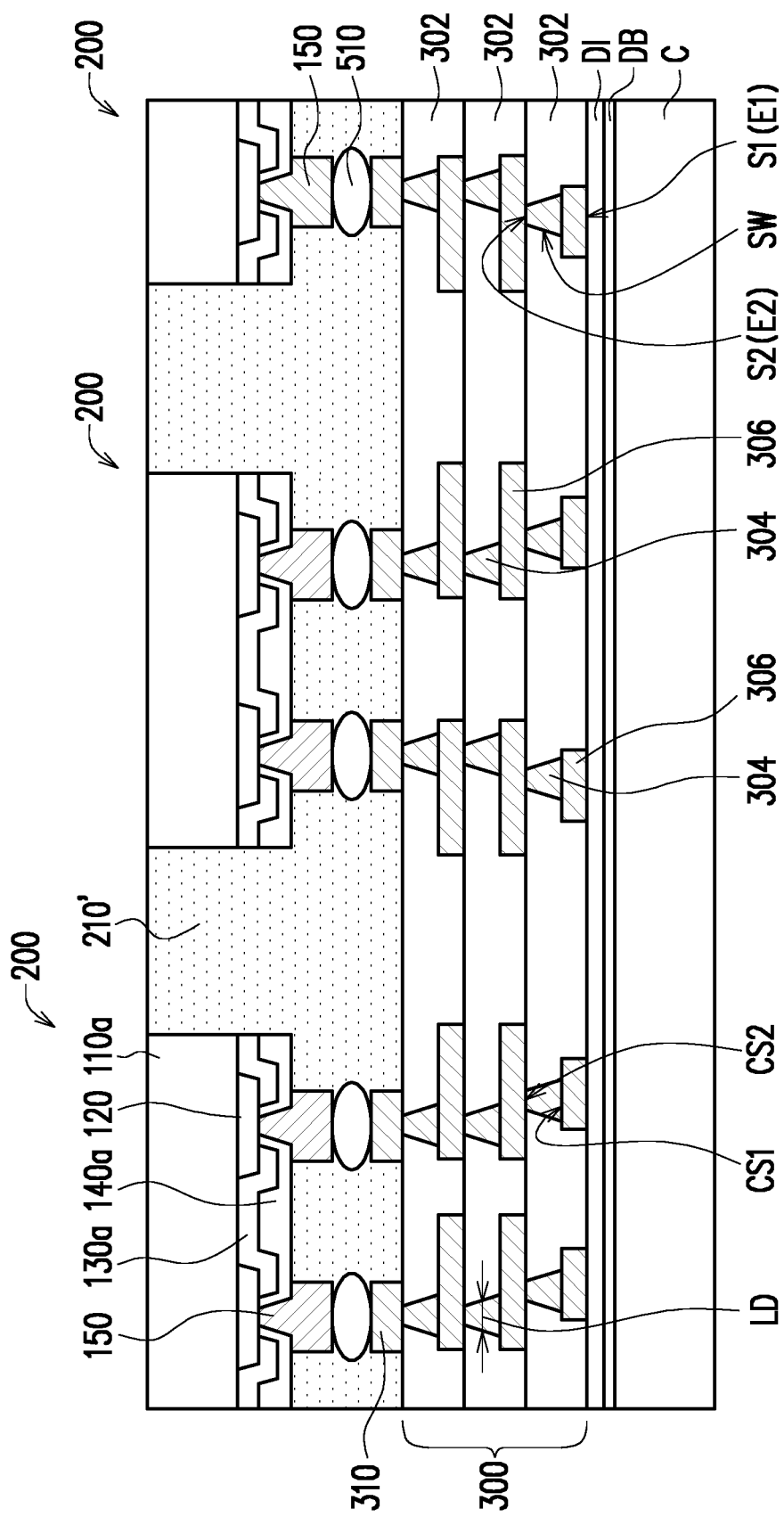

Referring to FIG. 16, after the conductive bumps 310 are bonded to the conductive pillars 150, an insulating encapsulation 210' is formed between the redistribution circuit structure 300 and the integrated circuit component 200 so as to encapsulate the conductive bumps 310 and the conductive pillars 150. The insulating encapsulation 210' may be made of materials similar to the insulating material 210 of FIG. 7, hence its description is omitted herein. An integrated fan-out package of the embodiment may be accomplished by similar methods shown in FIG. 12. For example, the redistribution circuit structure 300 may be de-bonded from the de-bonding layer DB such that the dielectric layer DI is separated from the carrier substrate C. Subsequently, the dielectric layer DI may be patterned to form contact openings, wherein conductive balls may be placed in the contact openings and be electrically connected to the redistribution circuit structure 300.

In the above-mentioned embodiments, the routing capability, electrical efficiency and reliability provided by the integrated fan-out packages is improved by using the conductive vias 304 having tapered sidewalls SW. The conductive vias 304 having a trapezoid shaped profile will have lower stress and larger lithography process window as compared to traditional structures.

In accordance with some embodiments of the present disclosure, a method of fabricating an integrated fan-out package is provided. The method includes the following steps. An integrated circuit component is provided on a substrate. An insulating encapsulation is formed on the substrate to encapsulate sidewalls of the integrated circuit component. A redistribution circuit structure is formed along a build-up direction on the integrated circuit component and the insulating encapsulation. The formation of the redistribution circuit structure includes the following steps. A dielectric layer and a plurality of conductive vias embedded in the dielectric layer are formed, wherein a lateral dimension of each of the conductive vias decreases along the build-up direction. A plurality of conductive wirings is formed on the plurality of conductive vias and the dielectric layer.

In accordance with alternative embodiments of the present disclosure, a method of fabricating an integrated fan-out package is provided. The method includes the following steps. A redistribution circuit structure is formed along a build-up direction on a substrate. The formation of the redistribution circuit structure includes the following steps. A plurality of conductive wirings is formed on the substrate. A plurality of conductive vias and a dielectric layer is formed to cover the plurality of conductive wirings, and a lateral dimension of each of the conductive vias decreases from a first end to a second end along the build-up direction. The first end is facing the substrate and the second end is opposite to the first end facing away from the substrate. Next, a plurality of conductive bumps on the redistribution circuit structure electrically connected to the plurality of conductive vias is formed. An integrated circuit component having a plurality of conductive pillars is then provided. The conductive bumps are bonded to the conductive pillars. An insulating encapsulation is formed between the redistribution circuit structure and the integrated circuit component to encapsulate the conductive bumps and the conductive pillars.

In accordance with yet alternative embodiments of the present disclosure, an integrated fan-out package including an integrated circuit component, an insulating encapsulation, a redistribution circuit structure is provided. The insulating encapsulation laterally encapsulating sidewalls of the integrated circuit component. The redistribution circuit structure includes a plurality of conductive vias embedded in a dielectric layer, and a plurality of conductive wirings. A lateral dimension of each of the conductive vias decreases from a first end to a second end, the first end is located in between the second end and the integrated circuit component. The plurality of conductive wirings is disposed on the plurality of conductive vias and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    at least one semiconductor die having conductive pillars, and the conductive pillars have lateral dimensions that increases along a first direction;
    through vias surrounding the at least one semiconductor die; and
    a redistribution circuit structure disposed on and electrically connected to the at least one semiconductor die and the through vias, wherein the redistribution circuit structure comprises a plurality of conductive vias, wherein a lateral dimension of each of the conductive vias decreases along the first direction, and a first surface of at least one of the plurality of conductive vias having the greatest lateral dimension of the plurality of conductive vias is directly connected to a second surface of the conductive pillars having the greatest lateral dimension of the conductive pillars.

2. The structure according to claim 1, further comprising an insulating encapsulant encapsulating the at least one semiconductor die and the through vias.

3. The structure according to claim 1, wherein each of the conductive vias has a tapered sidewall joining two opposing ends of the conductive vias.

4. The structure according to claim 1, wherein the redistribution circuit structure further comprises:
    a plurality of conductive wirings disposed on each of the plurality of conductive vias; and
    dielectric layers surrounding the plurality of conductive wirings and the plurality of conductive vias.

5. The structure according to claim 4, further comprising:
    a plurality of under-ball metallurgy (UBM) patterns disposed on the plurality of conductive wirings; and
    a plurality of connection pads disposed on the plurality of conductive wirings aside the plurality of under-ball metallurgy (UBM) patterns.

6. The structure according to claim 5, further comprising:
    a plurality of conductive balls disposed on the plurality of under-ball metallurgy (UBM) patterns; and
    a passive component disposed on the plurality of connection pads.

7. The structure according to claim 1, further comprising a plurality of conductive balls disposed on and electrically connected to the through vias.

8. A package comprising:
    a first dielectric layer and a plurality of first conductive vias embedded in the first dielectric layer, wherein a lateral dimension of each of the first conductive vias decreases along a build-up direction, and a top surface and a bottom surface of the first dielectric layer are aligned with surfaces of the plurality of first conductive vias;
    a plurality of first conductive wirings disposed on the plurality of first conductive vias and the first dielectric layer along the build-up direction;
    a plurality of second conductive vias disposed on the plurality of first conductive wirings, wherein a lateral dimension of each of the second conductive vias decreases along the build-up direction;
    a second dielectric layer covering the plurality of first conductive wirings and the plurality of second conductive vias, wherein a top surface of the second dielectric layer is aligned with a top surface of the plurality of second conductive vias, and a bottom surface of the second dielectric layer is aligned with a bottom surface of the plurality of first conductive wirings; and
    an integrated circuit component having conductive pillars, wherein the integrated circuit component is disposed below the first dielectric layer, and the conductive pillars are electrically connected to the plurality of first conductive vias.

9. The package according to claim 8, further comprising a passive component disposed above the second dielectric layer and electrically connected to the plurality of second conductive vias.

10. The package according to claim 8, further comprising:
    a plurality of second conductive wirings disposed on the plurality of second conductive vias and the second dielectric layer along the build-up direction;
    a plurality of third conductive vias disposed on the plurality of second conductive wirings, wherein a lateral dimension of each of the third conductive vias decreases along the build-up direction;
    a third dielectric layer covering the plurality of second conductive wirings and the plurality of third conductive vias, wherein a top surface of the third dielectric layer is aligned with a top surface of the plurality of third conductive vias, and a bottom surface of the third dielectric layer is aligned with a bottom surface of the plurality of second conductive wirings.

11. The package according to claim 10, further comprising:
- a plurality of third conductive wirings disposed on the plurality of third conductive vias and the third dielectric layer along the build-up direction;
- a fourth dielectric layer surrounding the plurality of third conductive wirings; and
- a plurality of connection pads disposed on the fourth dielectric layer and electrically connected to the plurality of third conductive wirings.

12. The package according to claim 8, further comprising a plurality of through vias surrounding the integrated circuit component and disposed below the first dielectric layer, and the plurality of through vias is electrically connected to the plurality of first conductive vias.

13. The package according to claim 12, further comprising an insulating encapsulant disposed below the first dielectric layer and surrounding the plurality of through vias and surrounding the integrated circuit component.

14. The package according to claim 13, wherein a top surface of the insulating encapsulant is in physical contact with a bottom surface of the first dielectric layer.

15. A method of fabricating a package structure, comprising:
- providing at least one semiconductor die on a substrate, wherein the at least one semiconductor die comprises conductive pillars having lateral dimensions that increases along a first direction;
- forming through vias surrounding the at least one semiconductor die; and
- forming a redistribution circuit structure stacked up along the first direction on the integrated circuit component and the through vias, wherein forming the redistribution circuit structure comprising:
  - forming a plurality of conductive vias electrically connected to the conductive pillars of the at least one semiconductor die and the through vias, wherein a lateral dimension of each of the conductive vias decreases along the first direction, and a first surface of at least one of the plurality of conductive vias having the greatest lateral dimension of the plurality of conductive vias is directly connected to a second surface of the conductive pillars having the greatest lateral dimension of the conductive pillars.

16. The method according to claim 15, further comprising:
- forming an insulating encapsulant encapsulating the at least one semiconductor die and the through vias.

17. The method according to claim 15, wherein forming the redistribution circuit structure further comprises:
- forming a plurality of conductive wirings disposed on each of the plurality of conductive vias; and
- forming dielectric layers surrounding the plurality of conductive wirings and the plurality of conductive vias.

18. The method according to claim 17, further comprising:
- forming a plurality of under-ball metallurgy (UBM) patterns on the plurality of conductive wirings; and
- forming a plurality of connection pads on the plurality of conductive wirings aside the plurality of under-ball metallurgy (UBM) patterns.

19. The method according to claim 18, further comprising:
- placing a plurality of conductive balls on the plurality of under-ball metallurgy (UBM) patterns; and
- disposing a passive component on the plurality of connection pads.

20. The method according to claim 15, further comprising:
- placing a plurality of conductive balls on a bottom surface of the through vias, and performing a reflow process to bond the plurality of conductive balls to the bottom surface of the through vias.

* * * * *